United States Patent [19]
Jones, Jr.

[11] Patent Number: 5,923,564
[45] Date of Patent: *Jul. 13, 1999

[54] PERFORMANCE ANALYSIS INCLUDING HALF-PATH JOINING

[75] Inventor: Robert F. Jones, Jr., Austin, Tex.

[73] Assignee: Advanced Micro Devices, Inc., Sunnyvale, Calif.

[*] Notice: This patent is subject to a terminal disclaimer.

[21] Appl. No.: 08/700,597

[22] Filed: Aug. 12, 1996

[51] Int. Cl.$^6$ .................................................. G06F 17/50
[52] U.S. Cl. ........................... 364/489; 364/488; 364/490
[58] Field of Search ................................... 364/488–491, 364/578; 395/500, 183.03, 183.08, 183.09; 327/202; 326/93; 371/22.1, 22.2, 22.3, 28, 72

[56] References Cited

U.S. PATENT DOCUMENTS

| | | | |
|---|---|---|---|
| 5,095,454 | 3/1992 | Huang | 364/578 |
| 5,416,362 | 5/1995 | Byers et al. | 327/202 |
| 5,428,622 | 6/1995 | Kuban et al. | 371/22.34 |
| 5,517,136 | 5/1996 | Harris et al. | 326/93 |
| 5,638,016 | 6/1997 | Eitrheim | 327/175 |
| 5,651,012 | 7/1997 | Jones, Jr. | 371/22.1 |
| 5,719,783 | 2/1998 | Kerzman et al. | 364/488 |

OTHER PUBLICATIONS

Jin–fuw Lee, Donald T. Tang, and C. K. Wong, *A Timing Analysis Algorithm for Circuit with Level–Sensitive Latches*, vol. 15, No. 5, May 1996, pp. 535–543.

IBM Technical Disclosure Bulletin, *Timing Verification Algorithm for Clock Design with Slack Stealing*, vol. 36, No. 10, Oct. 1993, pp. 249–253.

Timothy M. Burks, Karem A. Sakallah, and Trevor N. Mudge, *Critical Paths in Circuits with Level–Sensitive Latches*, IEEE Transactions on Very Large Scale Integration (VLSI) Systems, vol. 3, No. 2, Jun. 1995.

Burks et al "Indentification of Critical Paths In Circuits With Level–Sensitive Latches," IEEE, PP. 137–141, Nov. 1992.

Lin et al "Analyzing Cycle Stealing On Synchronous Circuits With Level–Sensitive Latches," IEEE, PP. 393–398, Jun. 1992.

Lockeyear et al "Optimal Retiming of Level–Clocked Circuits Using Symmetric Clock Schedules," IEEE, PP. 1097–1109, Sep. 1994.

*Primary Examiner*—Kevin J. Teska
*Assistant Examiner*—Vuthe Siek
*Attorney, Agent, or Firm*—Skjerven, Morrill, MacPherson, Franklin & Friel, LLP

[57] ABSTRACT

Critical speed paths through a latch-based logic circuit must contain at least one latch-to-latch combinational delay which exceeds the nominal phase time of the circuit. To identify this set of paths through latch-to-latch delays greater than the nominal phase time of the circuit (i.e., through interesting tLLs), a half-path joining approach is employed. Backward half-paths from fixed timing points forward through the network defined by a latch abstraction of the circuit to an interesting tLL are multiplicatively joined with forward half-paths from the interesting tLL forward to other fixed timing points to form a set of fixed-point-to-fixed-point (F2F) paths through the interesting tLL. Timing analysis is performed on the set of F2F paths to identify those which represent critical speed paths through the circuit.

15 Claims, 7 Drawing Sheets

PERFORMANCE ANALYSIS INCLUDING HALF-PATH JOINING

BACKGROUND OF THE INVENTION

1. Field of the Invention

The present invention relates to performance analysis of logic circuits, and more particularly, to a system for efficiently performing chip-level timing analysis in a latch-based logic design.

2. Description of the Related Art

Timing verification techniques are useful for determining whether a sequential circuit will run correctly under a given clock schedule. To make this determination, it is necessary to accurately model the timing performance of each of the circuit's components. All possible paths through the circuit must be analyzed to guarantee compatibility with data and clock timing. An identification of critical paths, i.e., those paths through the circuit that place the tightest constraints on the circuit's timing behavior, is of particular interest to designers who wish to identify why the circuit fails to meet a desired timing schedule.

While the concept of a critical path has been used for many years to analyze both combinatorial and sequential circuits, these analyses assume that storage elements are edge-triggered. If instead, a circuit includes level-sensitive latches, simplifications associated with edge-triggered device analysis break down. Recent work has extended the classical definition of critical path to better account for the timing properties of level sensitive latches. See e.g., T. M. Burks, K. A. Sakallah, and T. N. Mudge, *Critical Paths in Circuits with Level-Sensitive Latches*, IEEE TRANSACTIONS OF VERY LARGE SCALE INTEGRATION (VLSI) SYSTEMS, Vol. 3, No. 2, June 1995 at 273.

Level-sensitive latches, like edge-triggered "flip-flops," are sequential circuit elements; i.e., they are used to sample and store state at various points in a logic design. An ideal, edge-triggered flip-flop samples state at either the rising or falling edge of its enable signal, then maintains this value until the next triggering edge. A level-sensitive latch, on the other hand, follows the value of its data input whenever the enable is active. A level-sensitive latch is said to be "transparent" while its enable is active. When the enable transitions to inactive, the value of the input at that time is maintained.

It is a relatively simple problem to identify stages (sequential element to sequential element) which cause a circuit designed with edge-triggered state elements to fail. In particular, any combinational path which delivers data to state elements after the triggering edge is a failure. However, the problem is more complex for a circuit which includes level-sensitive latches. In particular, level-sensitive latches allow "borrowing" to occur between neighboring stages of combinational logic. When data arrives at a latch during the transparent phase, it flows immediately through to the next combinational stage. Thus a long stage can borrow time from a subsequent short stage, up to the end of the active phase of the latch enable. While such borrowing provides the logic designer with significantly more flexibility, it complicates the problem of timing analysis, as the number of adjacent stages which contributing to a critical path varies. Borrowing results in the linking (for purposes of timing analysis) of different numbers of stages along different paths to (or through) a particular circuit element. Furthermore, as operating frequency changes, the number of linked stages along a particular path changes.

In addition to the analytic complexity added by borrowing, the computational complexity (i.e., scaling) of the critical path search problem can make straightforward computational implementations intractable for large complex circuits. In general, the topology of a graph representation of the circuit of interest must be known to determine the computational complexity. Two characteristic parameters of the graph of a circuit, the average fanout or branching factor, B, and the average path length or depth, D, are important indicators of the computational complexity of the search. Running of a depth-first search is then $O(B^D)$. For a complex microprocessor with a fanout of 15 and average path length of 20, $3.33 \times 10^{23}$ paths flow from a single starting point. A straightforward computational implementation of the depth-first search problem would have to save and analyze each such path.

SUMMARY OF THE INVENTION

The algorithm proposed by Burks builds up the longest path or paths which end at each latch in the design. The paths incident on each latch are extended backwards in each iteration. An issue not addressed by Burks is the desire for information about not simply the worst path, but all bad paths. Extending the algorithm to provide this information results in a breadth-first search of the entire design, which in practice will require enormous physical memory. In contrast, the half-path joining approach described herein allows identification of either the worst paths or all bad paths. In a large design, the generation (and timing) of all paths approaches intractability due both to time- and memory-complexity, however the half-path joining approach includes a depth-first strategy which localizes access to the design, making the practical problem size much larger for real machines.

It has been discovered that critical speed paths through a latch-based logic circuit must contain at least one latch-to-latch combinational delay which exceeds the nominal phase time of the circuit. Therefore, the process of searching for critical paths through the circuit can be constrained to consider only the set of paths which include a latch-to-latch delay greater than the nominal phase time of the circuit.

To identify this set of paths through latch-to-latch delays greater than the nominal phase time of the circuit (i.e., through interesting tLLs), a half-path joining approach is employed. Backward half-paths from fixed timing points forward through the network defined by a latch abstraction of the circuit to an interesting tLL are multiplicatively joined with forward half-paths from the interesting tLL forward to other fixed timing points to form a set of fixed-point-to-fixed-point (F2F) paths through the interesting tLL. Timing analysis is performed on the set of F2F paths to identify those which represent critical speed paths through the circuit.

In one embodiment, a method for identifying critical paths in a latch-based logic circuit having a desired operating frequency includes latch abstraction generation, latch-to-latch delay (tLL) selection, fixed point to fixed point (F2F) path enumerating, and F2F path timing analysis steps. The latch abstraction generation step generates a latch abstraction of a circuit, wherein the latch abstraction includes latch elements, fixed timing points, and latch-to-latch delay (tLL) arcs. The latch abstraction represents a network of paths through the circuit wherein individual tLLs are coupled between latch elements and fixed timing points to correspond to the structure and timing behavior of the circuit. The tLL selection step selects tLLs which exceed the nominal phase time of the circuit. For each of the tLLs selected in the selecting step, F2F path enumerating steps enumerate F2F paths through the tLL. For each of the F2F paths enumerated in the F2F path enumerating steps, timing analysis is performed on the F2F path.

In a further embodiment, the F2F path enumerating steps include the steps of performing a forward and a backward search of the network of paths represented in the latch abstraction, and combining forward half-paths with backward half-paths to provide an enumeration of F2F paths. The forward search step generates forward half-paths from the selected tLL forward to fixed timing points, and the backward search step generates backward half-paths from the selected tLL backward to fixed timing points, combining each of the forward half-paths with each of the backward half-paths to provide an enumeration of F2F paths.

In another embodiment, a method for reducing computational load in a computer-implemented system for identification of critical paths in a latch-based logic circuit includes the steps of selecting latch-to-latch delays (tLL) from a data structure representing a latch abstraction of the circuit, the selected tLLs being those which exceed a nominal phase time for the circuit; performing a forward and a backward search of the network of paths represented in the latch abstraction, the forward search generating forward half-paths from the selected tLL forward to fixed timing points, and the backward search generating backward half-paths from the selected tLL backward to fixed timing points; combining each of the forward half-paths with each of the opposing backward half-paths to provide an enumeration of F2F paths; and performing timing analysis on the fixed timing point to fixed timing point (F2F) paths resulting from the combination of opposing forward and backward half-paths joined at corresponding ones of the selected tLLs.

In yet another embodiment, a timing analysis component includes selecting means, forward searching means, backward seaching means, joining means, F2F path timing means. The selecting means is coupled to data storage for selecting and indicating tLLs which exceed a nominal phase time of the circuit. Forward and backward searching means are coupled to the data storage for searching through a network of paths represented in a latch abstraction and coupled to the selecting means for receiving selected tLL indications. The forward searching means generates, for each selected tLL, forward half-paths from the selected tLL forward to fixed timing points. The backward searching means generates, for each selected tLL, backward half-paths from the selected tLL backward to fixed timing points. The joining means joins forward half-paths and backward half-paths to form candidate fixed-point-to-fixed-point (F2F) paths through selected tLLs. The joining means is coupled to the forward and backward searching means to receive forward and backward half-paths. F2F path timing means is coupled the joining means to receive F2F paths. The F2F path timing means computes a limit frequency for each F2F path and provides an indication of those paths for which the limit frequency is less than a target frequency.

BRIEF DESCRIPTION OF THE DRAWINGS

The present invention may be better understood, and its numerous objects, features, and advantages made apparent to persons of ordinary skill in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the invention. The description is intended to be illustrative of the invention and should not be taken to be limiting.

Figure 1A:
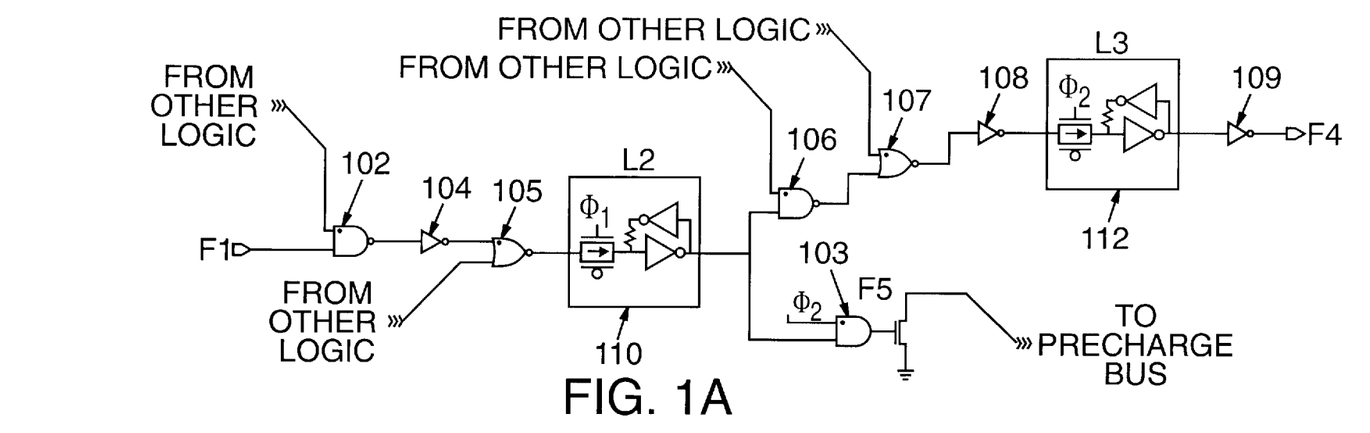
FIG. 1A is a circuit diagram of a representative circuit section.
Figure 1B:
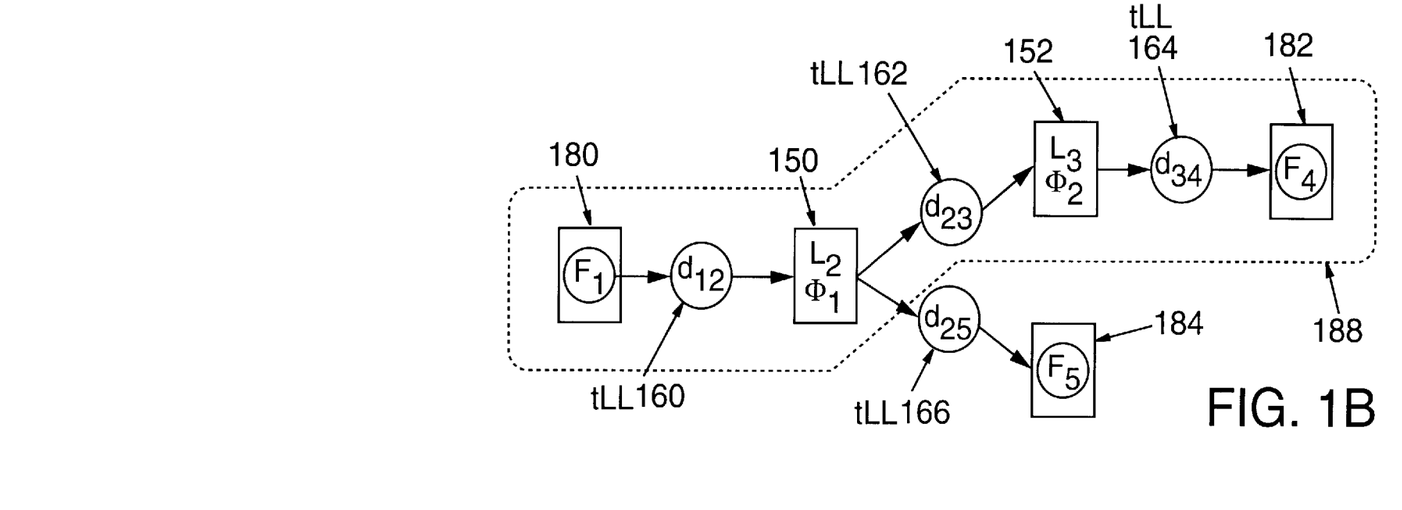
FIG. 1B is a latch abstraction diagram corresponding to the circuit section of FIG. 1A.

The timing behavior of a complex latch-based logic design can be represented abstractly using a network of latch elements, delay arcs, and fixed timing points. FIGS. 1A and 1B depict a simple circuit section and a corresponding latch abstraction of that circuit section. The circuit section of FIG. 1A includes combinatorial logic elements (e.g., gates 102–109) and sequential logic elements (e.g., flip-flops or latches 110 and 112). These physical elements of the circuit section map to abstraction elements as shown in FIG. 1B. The abstraction of FIG. 1B includes latch elements 150 and 152 connected by latch-to-latch delay arc (tLL) 162. Latch elements are used to represent timing points in the circuit section, including flip-flops, latches, and other clocked circuit elements. Latch-to-latch delays (tLLs) represent propagation delays through combinatorial logic and, to a lesser degree, through clocked circuit elements. As shown in FIG. 1B, certain aspects of the circuit section map to fixed timing points 180, 182, and 184. Fixed timing points are exact points in time with respect to a clock which may be structural, i.e., fixed by device characteristics, or may be fixed by specification. For example, timings at pad inputs are typically specified relative to a clock. Therefore, the pad inputs may be treated as fixed points for purposes of timing analysis. Other examples of fixed points include pre-charge bus nets, pre-charge driver inputs, output pads, and elements enabled by a gated clock. Latch-to-latch delays (tLLs) 160, 162, 164, and 166 connect respective fixed timing points and latch elements.

Figure 2A:
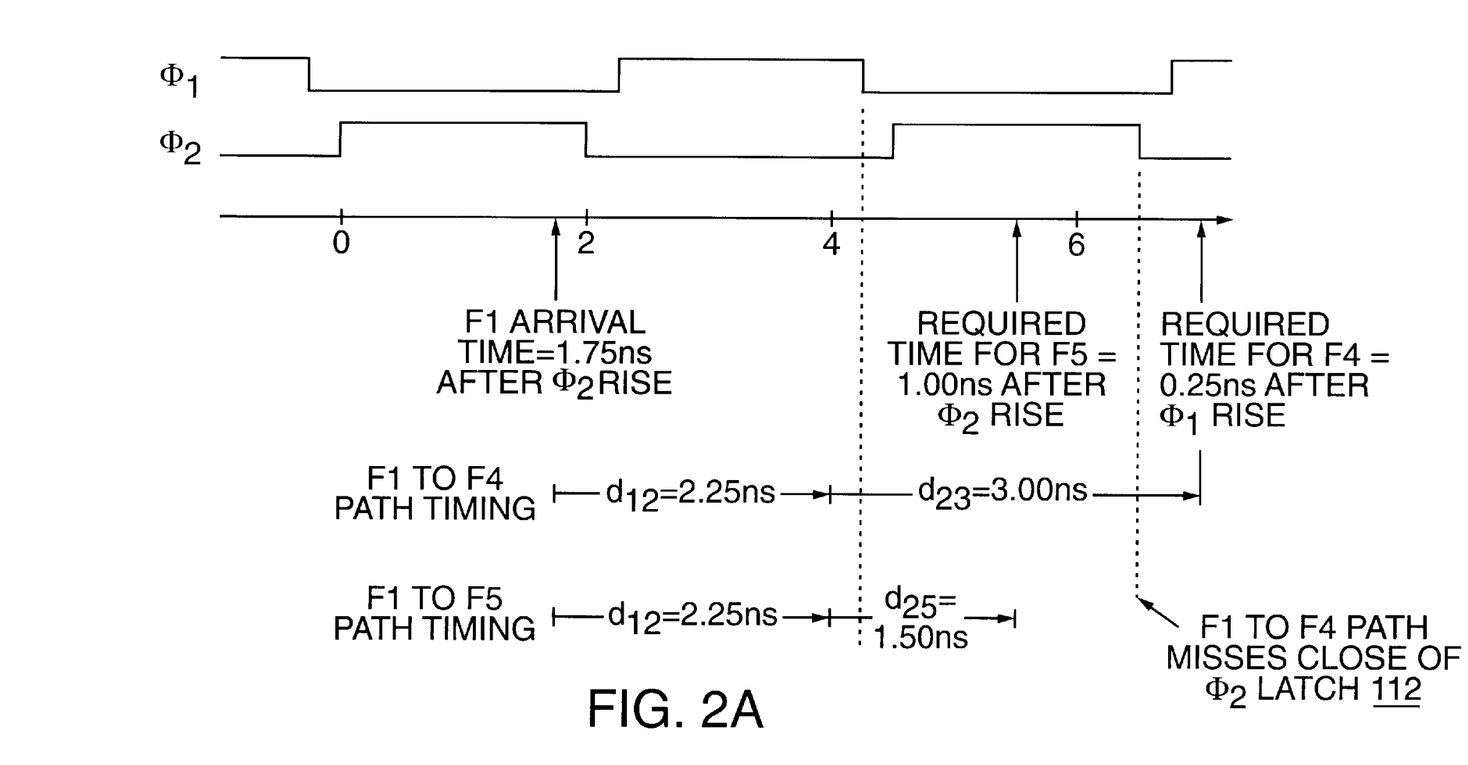
FIG. 2A is a timing diagram for the circuit section of FIG. 1A.
Figure 2B:
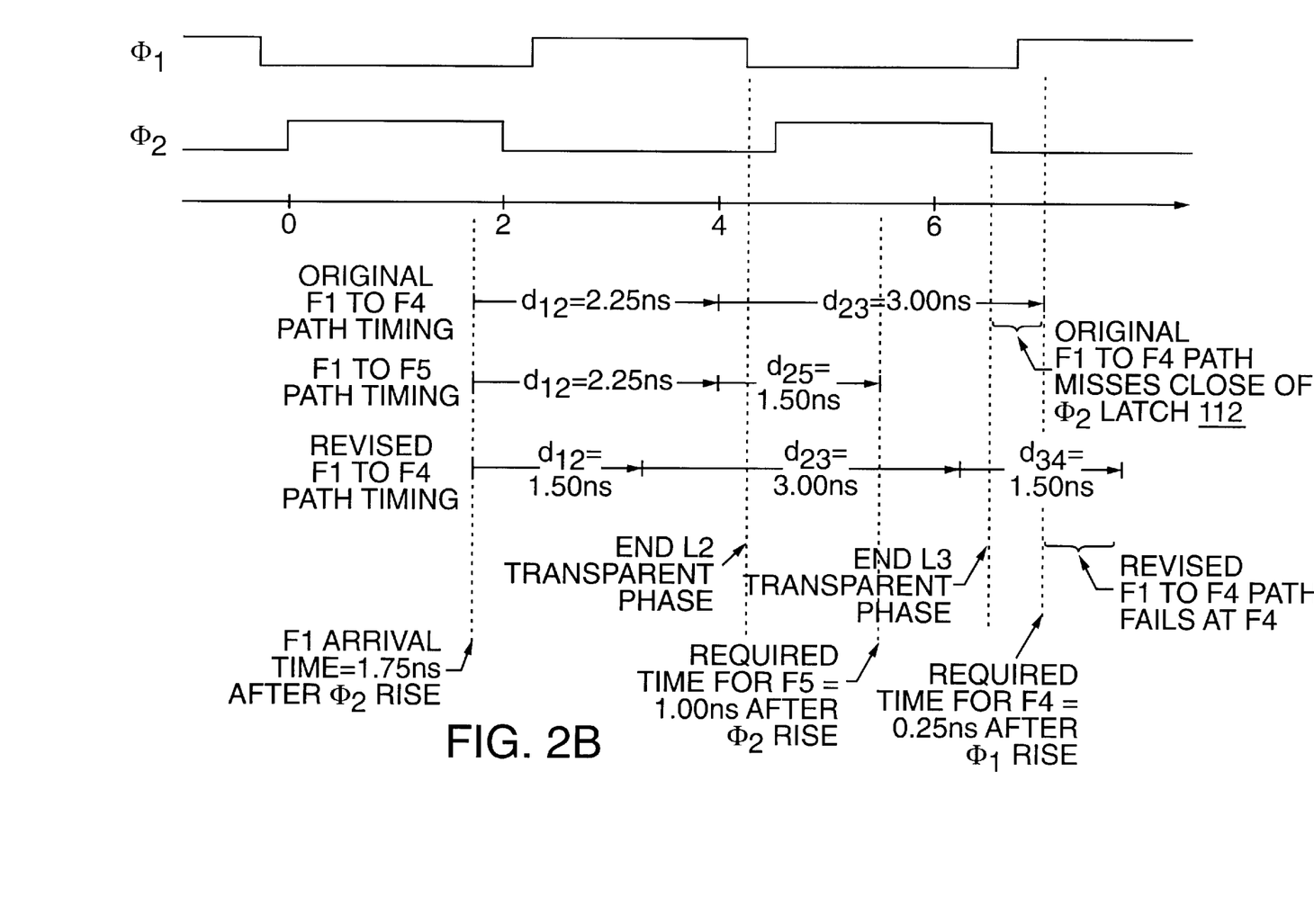
FIG. 2B is a revised timing diagram for a revised version of the circuit section of FIG. 1A.

The timing diagram of FIG. 2A illustrates accumulated delays through latch stages of the circuit section of FIG. 1A and an associated setup violation at latch 112. Whether or not the accumulated delays in fact create a setup violation is a function of the phase time (or frequency) of the circuit. FIG. 2A depicts a case where the phase time and tLLs along the fixed-point-to-fixed-point (F2F) path from 180 to 182 are incompatible. Such a setup violation can be eliminated by reducing the accumulated delays (i.e., $tLL_{12}$, $tLL_{23}$, or both $tLL_{12}$ and $tLL_{23}$) leading up to the violation along fixed-point-to-fixed-point (F2F) path 188. F2F path 188 from fixed point 180 to fixed point 182 is a critical path through the circuit section. FIG. 2B depicts revised timing along F2F path 188 (i.e., $F_1$ to $F_4$) in which tLL 160 (i.e., $d_{12}$) is reduced by 0.75 ns by eliminating gate 104. Revised path timing 190 meets the timing constraint imposed by the end L3 112's transparent phase; however, the shortened path (without gate 104) then fails at F4 182.

In general, a single circuit section element may map to multiple abstraction elements. Similarly, multiple circuit elements may map to a single abstraction element. While the mapping of physical circuit elements to abstraction elements is not one-to-one, it is straightforward and understood by persons of ordinary skill in the art. Suitable data representations for abstractions are numerous and include both custom software implementations and those provided by commercially available software products.

Figure 3:
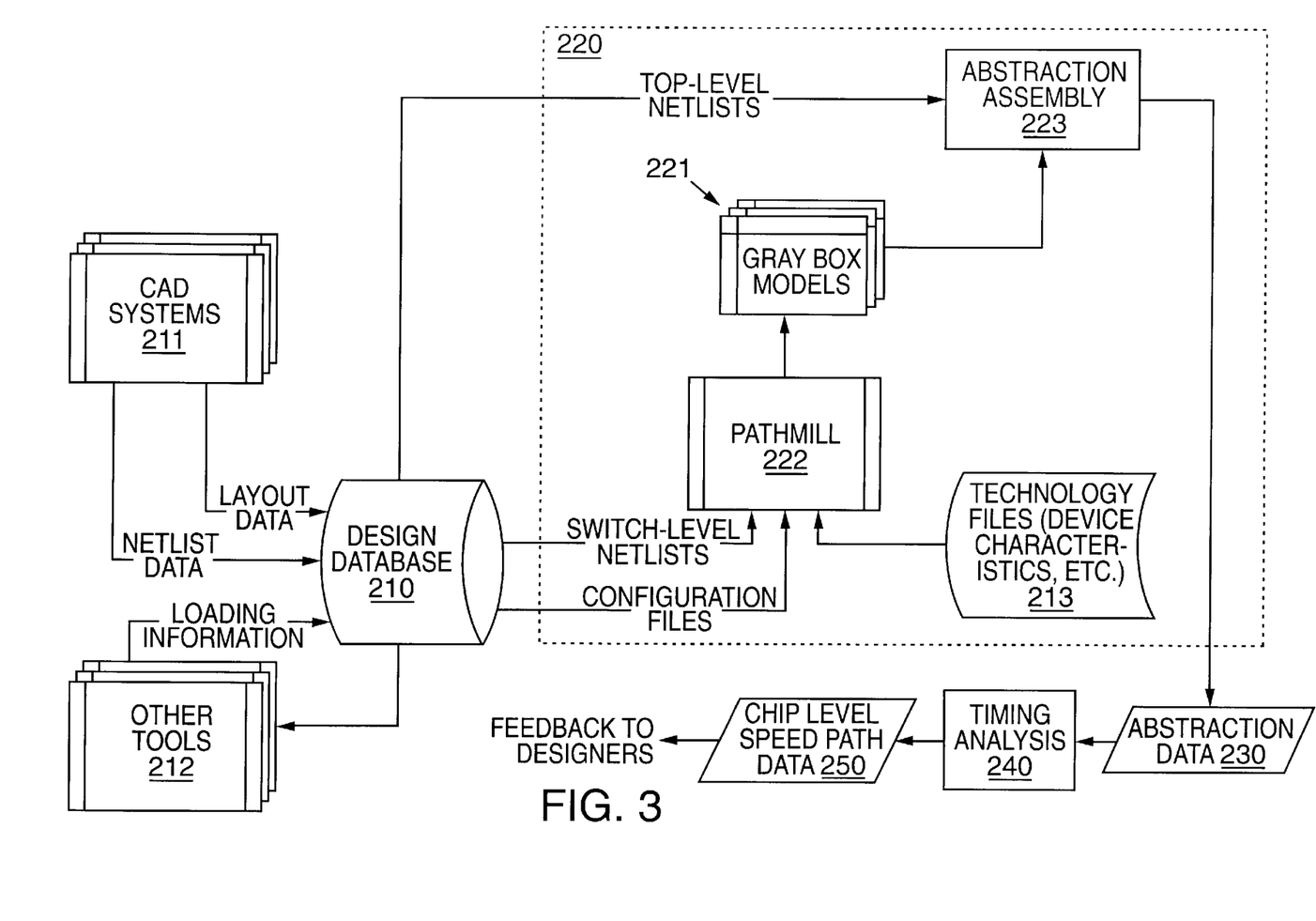
FIG. 3 is a flow diagram depicting a system for generating a latch abstraction network in accordance with the present invention.

In one embodiment of a system for performing timing analysis, a combination of translation software and design tools is used to generate the latch abstractions. FIG. 3 depicts an exemplary embodiment of such a system in which database 210 functions as a repository for netlist data provided by computer-aided design (CAD) systems 211. Database 210 stores and provides netlist representations of circuits and circuit element attributes. Other CAD tools 212 may supply additional loading information (e.g., layout parasitics) to database 211 in a back annotation process. After the logic has been designed and the circuit layout completed, the actual load seen by each driver due to interconnect, source/drain and gate capacitance is calculated. This process is called layout parasitic extraction. The load values are then back annotated for corresponding elements in the design database, allowing improved accuracy in subsequent simulation and timing analysis.

An abstraction generation component 220 receives (or retrieves) netlist data, configuration data, and technology files for a given circuit design and generates a data representation of the abstraction. In the exemplary embodiment of FIG. 3, abstraction generation component 220 includes Pathmill timing analysis software 222 operated to generate gray-box models 221 for each logic block (for a description, see *Pathmill User Manual*, copyright 1993, 1994 EPIC Design Technology), although alternative methods of characterizing the switch-level timing behavior of blocks are also suitable. For example, an abstraction can be generated directly from design data stored in database 210 and alternative timing analysis methods (e.g., SPICE software) can be employed.

An abstraction assembly component 223 receives a top-level netlist and gray-box models 221 (one for each circuit block). In an exemplary embodiment which includes Pathmill timing analysis software 222, gray-box models 221 include C code characterizations (.c files and associated. gray files) of circuit blocks. The C code (which includes a call to read the contents of the associated. gray file) is parsed by the abstraction assembly component 223 to extract and assemble the network of latches, delay arcs, and block ports forming a block-level abstraction. Abstraction assembly component 223 then assembles a complete chip-level abstraction using a top-level netlist retrieved from database 210 to identify the coupling points (ports) between the blocks which make up the chip-level design and which in a large design may number 100 or more. Abstraction assembly component 223 supplies the data representation 230 of the complete chip-level abstraction which is used by timing analysis component 240 to provide on chip-level speed path data 250 to designers. These data may then be used by designers to improve performance of the logic design.

The source code of a particular one of the gray-box models 221 includes a frequency-independent characterization of a circuit block and of abstraction network topology and delay arc information for the block. In an exemplary embodiment, Pathmill software (which is available commercially from EPIC Design Technology) is used for generating gray box models 221 which characterize individual circuit blocks, network topology and delays.

Abstraction assembly component 223 parses these Pathmill format files and provides a data representation 230 of a chip-wide latch abstraction. In an exemplary embodiment, data representation 230 includes a graph representation of a latch based logic circuit which created and traversed using routines provided by a commercial database system Pillar (available from HLD of Santa Clara, Calif.). Nonetheless, persons of ordinary skill in the art will recognize a variety of suitable commercial, public domain, and custom-designed alternatives to Pillar. Pathmill and its associated file formats are similarly illustrative and persons of ordinary skill in the art will recognize a variety of suitable alternatives. Regardless of the particular timing analysis software and abstraction representations employed in a system for global performance analysis, an exemplary embodiment of an analytical system implementing half-path joining will be better understood by referring to FIGS. 4A–9, which are now described.

Figure 4A:
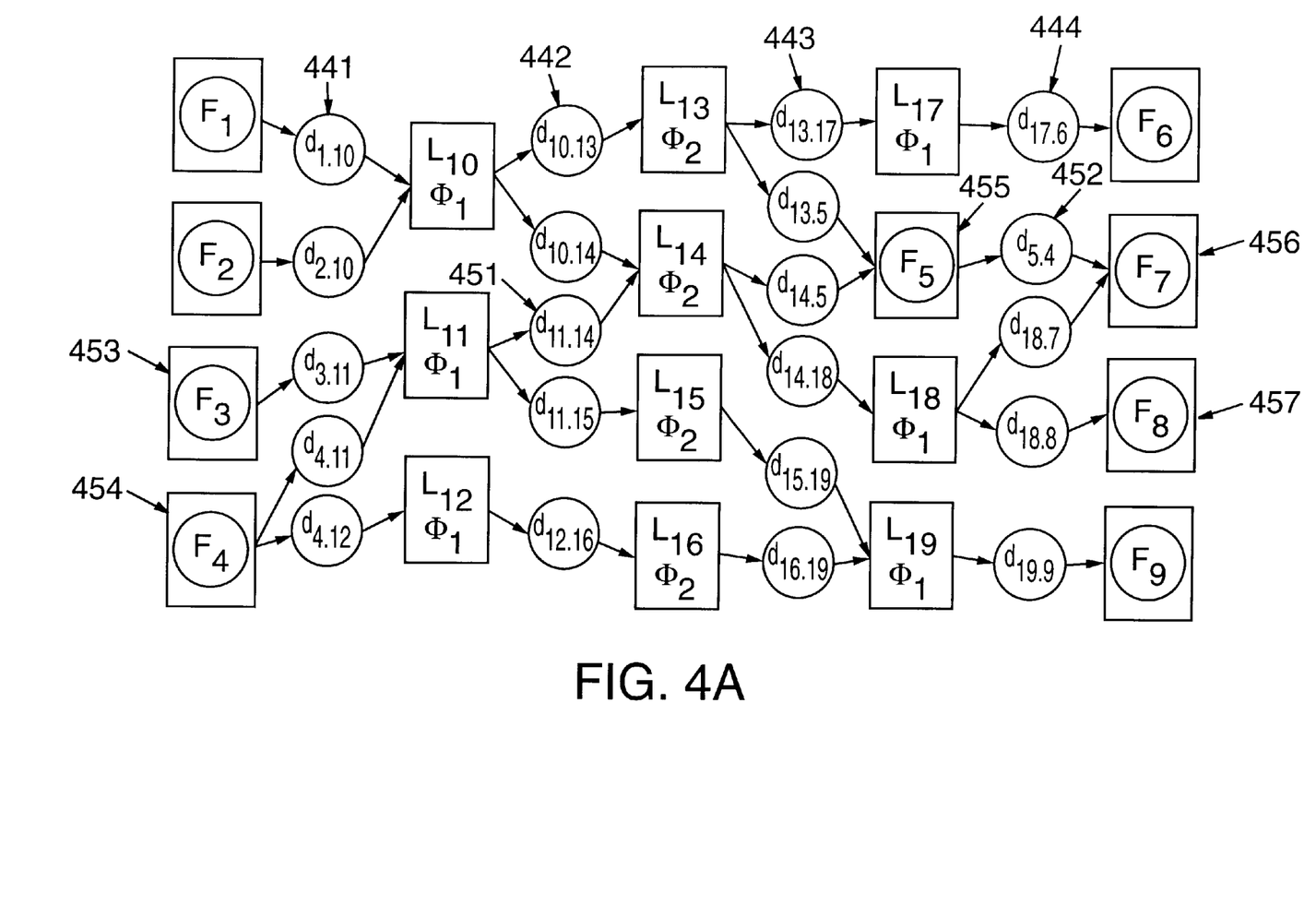
FIG. 4A is a latch abstraction network diagram representative of a latch abstraction generated in accordance with the present invention.

The network diagram of FIG. 4A illustrates the elements and network structure of a latch abstraction corresponding to a latch-based logic circuit. Even though FIG. 4A depicts a relatively simple abstraction network, twenty-four distinct F2F paths may be traced through the simple abstraction network. Depending on the profile of tLLs, any one could represent a critical path through the circuit. By performing timing analysis along each of the paths, critical paths can be identified. Indeed, paths can be ranked according to their limit frequencies and prioritized for design optimization. While such an exhaustive approach may be practical for small circuits and abstraction networks, it is impractical for an abstraction network corresponding to large, complex, latch-based designs of interest, such as that of a microprocessor. In an abstraction network corresponding to a modem microprocessor having upwards of three million transistors, millions of F2F paths may exist, any of which may represent a critical path. Therefore in comparison, the abstraction network of FIG. 4A is of trivial complexity. Nonetheless, useful insight into the problem can be gained from FIGS. 4A and 4B.

For a hypothetical latch based logic circuit (not shown) which fails to meet a design target frequency, any critical speed path through the circuit must contain at least one latch-to-latch delay path (tLL) which exceeds the nominal phase time of the circuit where the nominal phase time of an N-phase, latch-based logic circuit with a target frequency, $v_{target}$, is $$\frac{1}{Nv_{target}}.$$

For example, in a two-phase clocked circuit having a 66 MHz design target frequency, the nominal phase time is 7.5 ns and any fixed point to fixed point (F2F) path which fails at a frequency less than the target frequency must include a tLL greater than 7.5 ns.

Figure 4B:
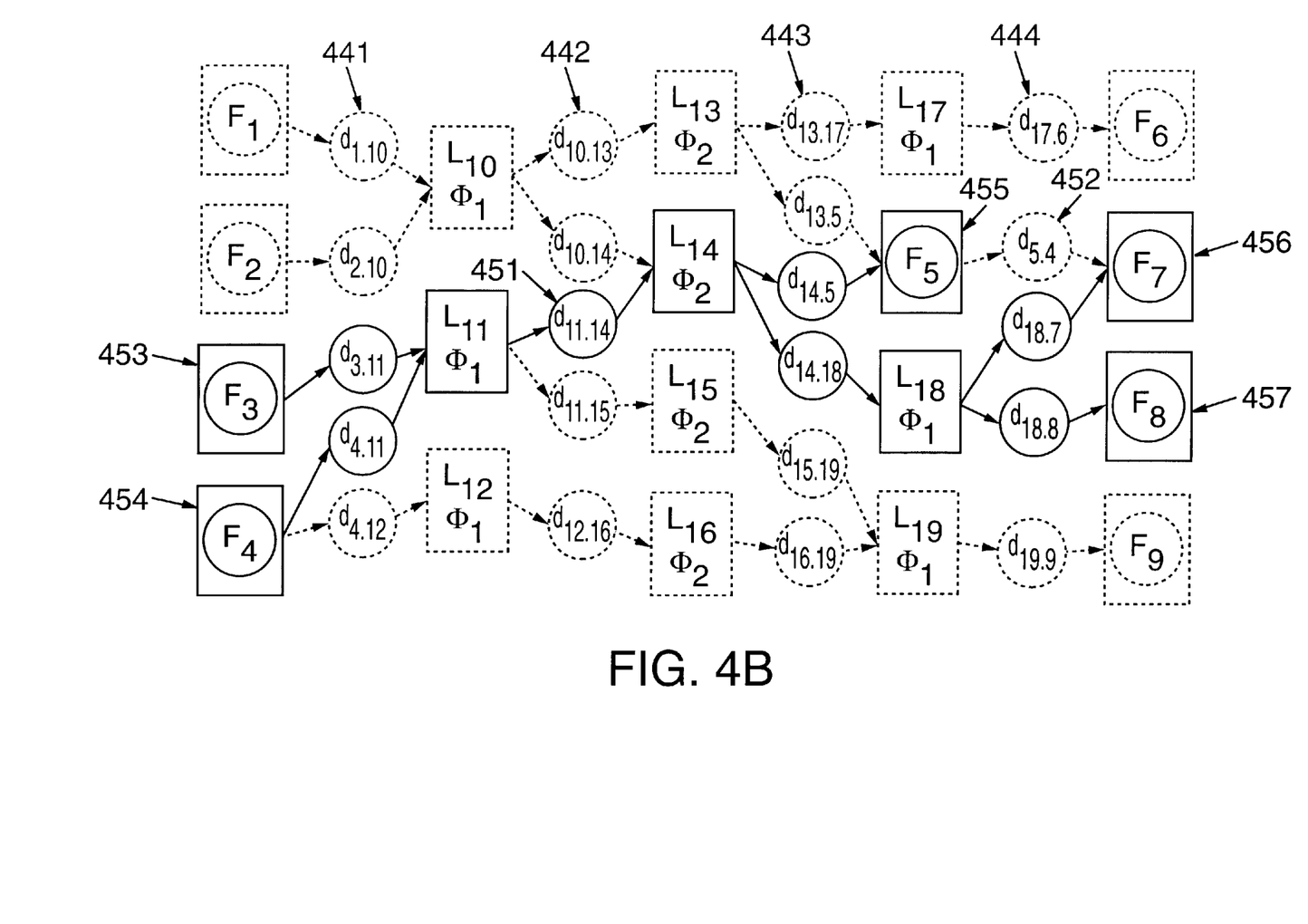
FIG. 4B is a subset of the latch abstraction network diagram of FIG. 4A depicting the half paths on either side of a latch-to-latch delay arc, wherein the half paths depicted are identified in accordance with the present invention.

Any tLL greater than the nominal phase time requires time borrowing into the transparent phase of the next latch. In the example of FIG. 4B, time borrowing associated with tLL 451 is into $\Phi_2$ latch$_{14}$. Timing problems are caused by a failure to resolve time borrowing that occurs at a tLL (or series of tLLs). Borrowed time may be repaid along an F2F path at tLLs less than the normal phase time. Unless borrowing occurs at some tLL along the F2F path, the path is guaranteed to meet the target frequency. Therefore, the process of searching for a critical path through the abstraction can be constrained to consider only to paths containing a tLL greater than the nominal phase time.

Referring now to FIG. 4B, if the delay associated with delay arc $d_{11.14}$ (i.e., tLL 451 between $\Phi_1$ latch$_{11}$ and $\Phi_2$ latch$_{14}$) is the only tLL greater than $\frac{1}{2}v_{target}^{-1}$, then only that subset of the F2F paths which pass through tLL 451 can be critical paths. FIG. 4B depicts this subset which consists of candidate paths ($F_3$-to-$F_5$, $F_3$-to-$F_7$, $F_3$-to-$F_8$, $F_4$-to-$F_5$, $F_4$-to-$F_7$, and $F_4$-to-$F_8$). Of course, the six paths are each only candidate critical paths as time borrowing may or may not be resolved. Note that candidate critical paths terminate at fixed points and that tLL 452 is not a part of any candidate critical path.

Figure 5:
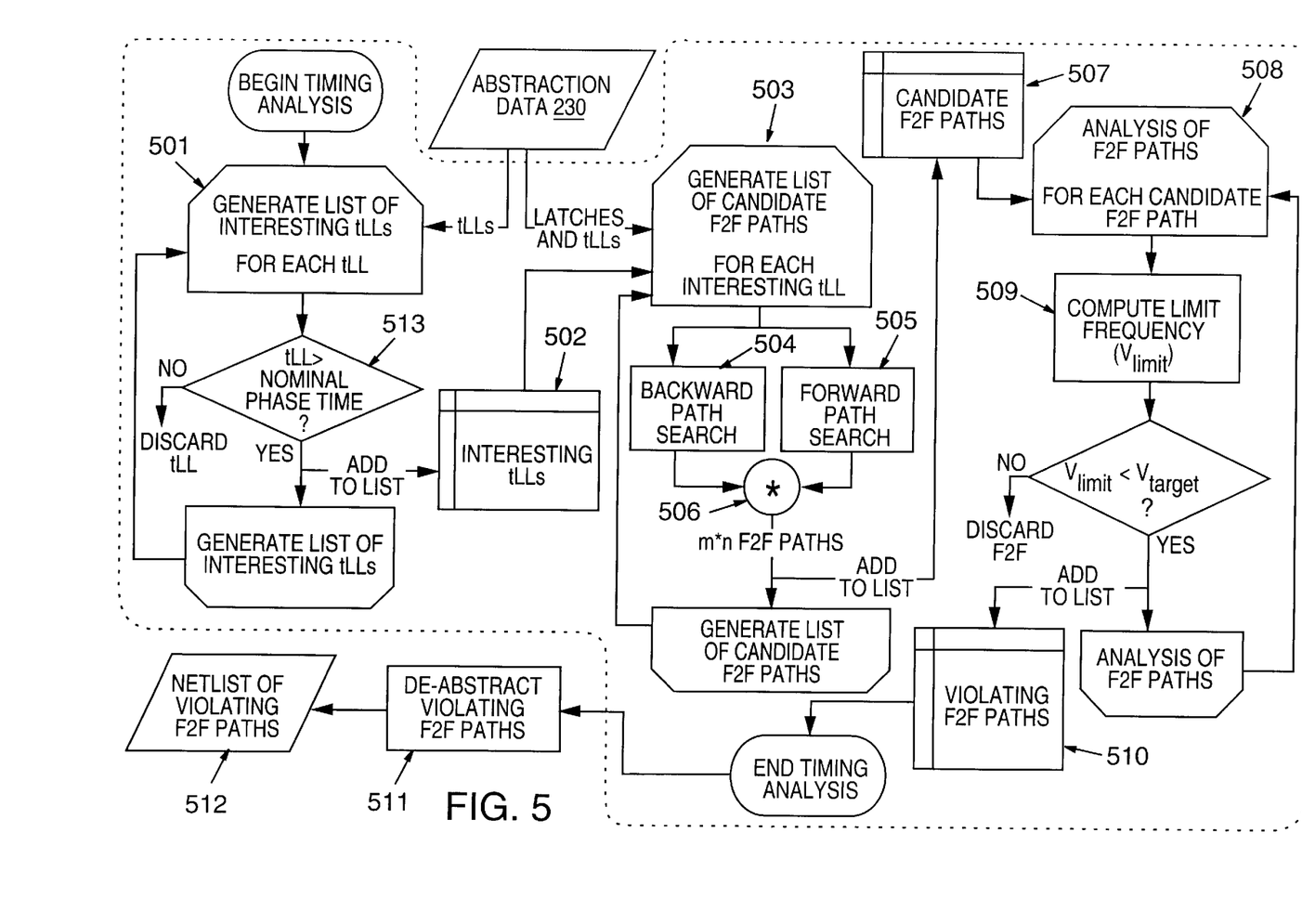
FIG. 5 is a top-level flow diagram depicting a system for performing chip-level timing analysis in accordance with the present invention.

FIG. 5 is a flow chart depicting the operation of timing analysis component 240 which reads data representation 230 and performs timing analysis on the abstraction represented therein. In an exemplary embodiment of FIG. 5, data representation 230 includes an abstraction graph network represented in data structures and accessed with routines provided by Pillar, although alternate data structures and database systems for representing abstraction network data are also suitable.

Timing analysis component 240 traverses the abstraction network graph of data representation 230, reading tLL values and adding a data representation of those tLLs which exceed the nominal phase time of the circuit to a list 502 of interesting tLLs (see loop 501). For each interesting tLL stored in list 502, timing analysis component 240 enumerates the set F2F paths through the tLL (see loop 503). This set of candidate paths is generated by performing a search in both the forward and backward directions (see steps 505 and 504, respectively) to provide "m" backward and "n" forward half-paths. In an exemplary embodiment, searches are performed depth-first although alternative search strategies would also be suitable. Half-paths are multiplicatively joined in step 506 to form m*n candidate F2F paths, data representations of which are added to list 507.

Loop 508 performs timing analysis on each candidate F2F path stored in list 507. In step 509, the limit frequency ($v_{limit}$) for an F2F path is computed using a binary search algorithm which, in an exemplary embodiment is in accordance with pseudocode (Pass-Fail( ) and Binary-Frequency-Search( )) described below.

```
Pass-Fail(path, frequency)
    Tcurrent = <data arrival time at starting fixed point>;
    Tcurrent = Tcurrent + <delay of first tLL>;
    foreach <latch, L, and subsequent tLL, D, in path> begin
        Ttest = <end of transparent phase of L>;
        if (Tcurrent > Ttest) then
            return FAIL;
        Tcurrent = Tcurrent + <delay of D>;
    end /* foreach */
    Ttest = <data required time at ending fixed point>;
    if (Tcurrent > Ttest) then
        return FAIL
    else return PASS;
end /* Pass-Fail */
```

The Pass-Fail( ) routine is used to test a path at a given frequency. The frequency dependence is manifest in the transparent phases of the latches. Data arrival and required times at fixed points may or may not depend on frequency.

```
Binary-Frequency-Search(path, minimum test frequency,
                                        maximum test frequency, bucket size)
    Fmax = <maximum test frequency>;
    Fmin = <minimum test frequency>;
    if (Pass-Fail(path, Fmax) == PASS) then
        return Fmax;
    if (Pass-Fail(path, Fmin) == FAIL) then
        return Fmin;
    while ((Fmax - Fmin) > <bucket size>) begin
        Fmid = (Fmax + Fmin) / 2;
        if (Pass-Fail(path, Fmid) == PASS then
            Fmin = Fmid
        else Fmax = Fmid;
    end /* while */
    return Fmin;
end /* Binary-Frequency-Search */
```

The Binary-Frequency-search( ) routine wraps the Pass-Fail test and chooses test frequencies to quickly converge to the operating frequency of the path.

Alternate embodiments of step 509 for computing $v_{limit}$ are also suitable. For example, one such alternative embodiment sweep linearly down in frequency from Fmax, using a substantially similar Pass-Fail ( ) test to identify first (highest) frequency at which the path operates correctly. Another alternative embodiment calculates $v_{limit}$ directly by solving a system of equations using an approach such as Gaussian elimination. Persons of ordinary skill in the art will appreciate these and other suitable implementations and algorithms for computing $v_{limit}$. Step 509 includes any such suitable implementation or algorithm.

Data representations of those F2F paths which fail to meet the target frequency are added to list 510 of violating F2F paths. Violating F2F paths are then de-abstracted to produce a netlist of violating paths which can be used by a designer in optimizing the speed paths.

Referring illustratively to the abstraction network of FIGS. 4A and 4B, the generation of F2F paths by timing analysis component 240 is now further explained. A representation of the network of FIG. 4A is provided by abstraction data store 230. Loop 501 successively retrieves tLL data (e.g., for tLLs 441, 442, 443, etc.) from abstraction data store 230 and determines whether each tLL is greater than the nominal phase time of the circuit. Data representing those tLLs which exceed the nominal phase time are added to list 502 of interesting tLLs. Illustratively, in the context of FIG. 4B, tLL 451 is the only interesting tLL and an instance of list 502 computed for the abstraction network of FIG. 4 includes data for tLL 451 only. All other tLLs would be discarded at decision point 513.

Loop 503 successively retrieves interesting tLL data from list 502 and enumerates the set of F2F paths through each interesting tLL retrieved. Beginning at each interesting tLL, loop 503 searches backwards and forwards through the network of paths represented in the data of abstraction store 230. Loop 503 searches for half-path segments defined at one end by a fixed point and at the other by the interesting tLL. Forward and backward half-paths identified in steps 504 and 505 are multiplicatively joined in step 506. In the illustration of FIG. 4B, half-paths from fixed points 453 and 454 to tLL 451 are enumerated in backward search step 504, and half-paths from tLL 451 to fixed points 455, 456 and 457 are enumerated in forward search step 505. In step 506, the two backward and three forward paths are conjoined to form 6 candidate F2F paths ($F_3$-to-$F_5$, $F_3$-to-$F_7$, $F_3$-to-$F_8$, $F_4$-to-$F_5$, $F_4$-to-$F_7$, and $F_4$-to-$F_8$) which are each added to list 507.

A description of improvements on the half-path joining approach for performing chip-level timing analysis is provided in a U.S. Pat. No. 5,651,012 which is incorporated herein by reference.

Other Embodiments

While the invention has been described with reference to various embodiments, it will be understood that these embodiments are illustrative and that the scope of the invention is not limited to them. Many variations, modifications, additions, and improvements of the embodiments described are possible.

For example, it will be appreciated by persons of ordinary skill in the art that alternative components or methods for generating the latch abstraction would also be suitable. In an alternative embodiment to that shown in FIG. 3, abstraction generation component 220 retrieves design data directly from design database 210 and assembles data representation 230 of a chip-wide latch abstraction without intermediate components such as Pathmill 222 and without an intermediate representation such as gray box models 221. In this alternative embodiment, abstraction generation component 220 generates a data representation 230 of the latch abstraction as follows:

Foreach starting fixed point search forward to next sequential elements (latches or fixed points);

Create the appropriate latches and fixed points in the abstraction and a tLL connecting each to the initial fixed point;

Time EACH combinational path from the initial fixed point to the new sequential elements, annotating the maximum delay onto each new tLL.

Repeat, starting from the set of new sequential elements, terminating when no logic exists forward from these elements.

In a presently preferred embodiment, timing analysis component 240 is software executable on a general purpose computer. Nonetheless, persons of ordinary skill in the art will recognize that a variety of alternate implementations of timing analysis component 240, including implementations as specialized logic circuits or as firmware for a special purpose processor, are also suitable.

Although some embodiments in accordance with the flow chart of FIG. 5 complete operations associated with a first loop before the start of operations associated with a second loop, no such limitation is required. Persons of ordinary skill in the art will appreciate that alternate sequences are also suitable. For example, list 502 of interesting tLLs need not be fully assembled before loop 503 (also 503a, 503b, or 503c) begins to generate candidate F2F paths. Similarly, list 507 of candidate F2F paths need not be fully assembled before loop 508 begins F2F path timing analysis. As a result, the sequential evaluation of successive loops in the above description is merely illustrative. Alternate software structures and flow controls which preserve the progression of computations (e.g., from an abstraction representation to an interesting tLL to a forward and a backward half path to a candidate F2F path to a violating F2F path) would be suitable.

Also, intermediate data stores, e.g., 502, 507, and 510, are merely illustrative. Alternative embodiments of the present invention may pass data from step-to-step or component-to-component as parameters to a function or procedure call, as part of an interprocess communication, as entries in a consolidated data store or stores, etc. Furthermore, lists (e.g., list 502 of interesting tLLs, list 507 of candidate F2F paths, list 510 of violating F2F paths, etc.) need not be organized as linked lists. Arrays of structures, arrays of pointers to such structures, doubly- and singly-linked lists, and other traversable collections of data objects are all be suitable.

These and other variations, modifications, additions, and improvements may fall within the scope of the invention as defined in the claims which follow.

What is claimed is:

1. A method for identifying critical paths in a latch-based logic circuit having a desired operating frequency, the method comprising the steps of:

generating a latch abstraction of the circuit, wherein the latch abstraction includes a plurality of latch elements, a plurality of fixed timing points, and a plurality of latch-to-latch delay (tLL) arcs, the latch abstraction representing a network of paths through the circuit wherein individual ones of the tLL arcs are coupled between ones of the latch elements and the fixed timing points to correspond to the structure and timing behavior of the circuit;

selecting those tLLs which exceed a nominal phase time of the circuit;

for each of the tLLs selected in the selecting step, enumerating a plurality of fixed point to fixed point (F2F) paths through the tLL; and for each of the F2F paths enumerated in the enumerating steps, performing timing analysis on the F2F path.

2. A method for identifying critical paths in a latch-based logic circuit, as recited in claim 1, wherein each of the enumerating steps includes the substeps of:

performing a forward and a backward search of the network of paths represented in the latch abstraction, the forward search generating a plurality of forward half-paths from the selected tLL forward to first ones of the fixed timing points, and the backward search generating a plurality of backward half-paths from the selected tLL backward to second ones of the fixed timing points; and combining each of the forward half-paths with each of the backward half-paths to provide an enumeration of F2F paths.

3. A computer program implementing the method of claim 1, encoded on computer readable media.

4. A plurality of independently executable computer programs implementing the method of claim 1, the independently executable computer programs coupled by data storage and encoded on computer readable media.

5. A method for reducing computational load in a computer-implemented system for identification of critical paths in a latch-based logic circuit, the method comprising the steps of:

selecting certain of a plurality of latch-to-latch delays (tLL) from a data structure representing a latch abstraction of the circuit, the selected tLLs being those which exceed a nominal phase time for the circuit;

performing a forward and a backward search of the network of paths represented in the latch abstraction, the forward search generating a plurality of forward half-paths from the selected tLL forward to first ones of the fixed timing points, and the backward search generating a plurality of backward half-paths from the selected tLL backward to second ones of the fixed timing points;

combining each of the forward half-paths with each of the opposing backward half-paths to provide an enumeration of F2F paths; and performing timing analysis on the fixed timing point to fixed timing point (F2F) paths resulting from the combination of opposing forward and backward half-paths joined at corresponding ones of the selected tLLs.

6. The method of claim 5, wherein the step of combining further comprises the step of multiplicatively combining N forward and M- opposing backward-half-paths.

7. The method of claim 5, further comprising the step of:

programming a general purpose computer to perform at least one of the steps of selecting certain of a plurality of latch-to-latch delays, performing a forward and a backward search of the network of paths represented in the latch abstraction, combining each of the forward half-paths with each of the opposing backward half-paths, and performing timing analysis on the fixed timing point to fixed timing point (F2F) paths.

8. The method of claim 5, further comprising the step of:

executing a computer program having code which implements at least one of the steps of selecting certain of a plurality of latch-to-latch delays, performing a forward and a backward search of the network of paths represented in the latch abstraction, combining each of the forward half-paths with each of the opposing backward half-paths, and performing timing analysis on the fixed timing point to fixed timing point (F2F) paths.

9. The method of claim 5, further comprising the step of:

performing at least one of the steps of selecting certain of a plurality of latch-to-latch delays, performing a forward and a backward search of the network of paths represented in the latch abstraction, combining each of the forward half-paths with each of the opposing backward half-paths, and performing timing analysis on the fixed timing point to fixed timing point (F2F) paths utilizing special purpose logic.

10. In a system for identifying critical paths in a latch-based logic circuit wherein the network structure and timing behavior of the circuit is represented in data storage as a latch abstraction having a plurality of latch elements, a plurality of fixed timing points, a plurality of latch-to-latch delay (tLL) arcs, and a network of paths therethrough, a timing analysis component comprising:

selecting means coupled to the data storage for selecting and indicating those of the tLLs which exceed a nominal phase time of the circuit;

forward and backward searching means coupled to the data storage for searching through the network of paths represented in the latch abstraction and coupled to the selecting means for receiving selected tLL indications, the forward searching means generating for each selected tLL, a plurality of forward half-paths from the selected tLL forward to first ones of the fixed timing points, the backward searching means generating for each selected tLL, a plurality of backward halfpaths from the selected tLL backward to second ones of the fixed timing points;

means for joining ones of the forward half-paths and ones of the backward half-paths to form a plurality of candidate fixed-point-to-fixed-point (F2F) paths through selected ones of the tLLs, the joining means coupled to the forward and backward searching means to receive forward and backward half-paths;

F2F path timing means coupled the joining means to receive F2F paths, the F2F path timing means computing a limit frequency for each F2F path and providing an indication of those paths for which the limit frequency is less than the target frequency.

11. A timing analysis component, as recited in claim 10, wherein the joining means multiplicatively joins N forward- and M opposing backward-half-paths to provide M*N F2F paths to F2F path timing means.

12. A timing analysis component, as recited in claim 10, wherein one of the selecting means, the forward searching means, the backward searching means, the joining means, and the F2F path timing means comprise software executable on a general purpose processor.

13. A timing analysis component, as recited in claim 10, wherein one of the selecting means, the forward searching means, the backward searching means, the joining means, and the F2F path timing means comprise special purpose logic.

14. A timing analysis component, as recited in claim 10, wherein the forward searching means, the backward searching means, the joining means, and the F2F path timing means are coupled via intermediate data structures represented in the data storage.

15. A timing analysis component, as recited in claim 14, wherein the data storage includes memory- and file system-provided data storage.

* * * * *